United States Patent [19]

Clark

[11] 4,039,960
[45] Aug. 2, 1977

[54] AUTOMATIC PHASING CIRCUIT TO TRANSFER DIGITAL DATA FROM AN EXTERNAL INTERFACE CIRCUIT TO AN INTERNAL INTERFACE CIRCUIT

[75] Inventor: James Monroe Clark, Cedar Grove, N.J.

[73] Assignee: International Telephone and Telegraph Corporation, Nutley, N.J.

[21] Appl. No.: 700,932

[22] Filed: June 29, 1976

[51] Int. Cl.² ............... H03B 3/04; H03K 5/18; H03K 19/08
[52] U.S. Cl. .............. 328/155; 307/DIG. 1; 307/208; 307/269; 328/63
[58] Field of Search ......... 307/208, 269, DIG. 1; 328/63, 155; 178/69.5 R

[56] References Cited
U.S. PATENT DOCUMENTS

| | | | |
|---|---|---|---|
| 3,593,160 | 7/1971 | Moore | 328/63 |
| 3,942,124 | 3/1976 | Tarczy-Hornoch | 307/208 |
| 3,980,820 | 9/1976 | Niemi et al. | 178/69.5 R |

*Primary Examiner*—Stanley D. Miller, Jr.

*Attorney, Agent, or Firm*—John T. O'Halloran; Alfred C. Hill

[57] ABSTRACT

The phasing circuit transfers digital data from an external interface circuit to an internal interface circuit with no bit errors and no violation of bit count integrity under control of an external clock having a given frequency and a given phase and an internal clock having a frequency equal to the given frequency and a phase that is different than the given phase. The phasing circuit includes a data output from the external interface circuit, a first clock output to couple the external clock from the external interface circuit, a data input to the internal interface circuit, at least a second clock output to couple the internal clock from the internal interface circuit, at least first and second D-type flip flops having their D inputs and Q outputs coupled in cascade with each other, the data output and the data input and logic circuitry coupled to the clock input of each of the first and second flip flops, the second clock output and a selected one of the data output and the first clock output to select the internal clock or an inverted version of the internal clock as the clock for the first flip flop to provide the desired digital data transfer.

6 Claims, 13 Drawing Figures

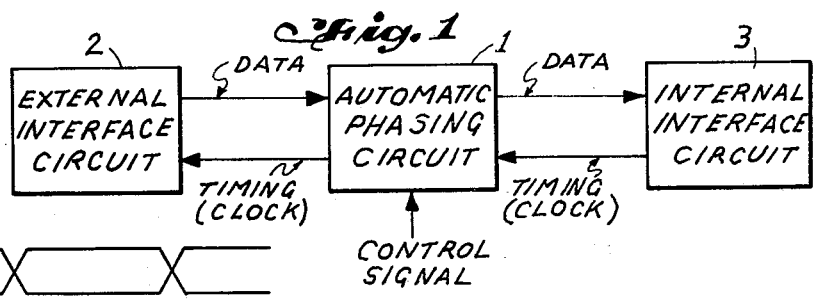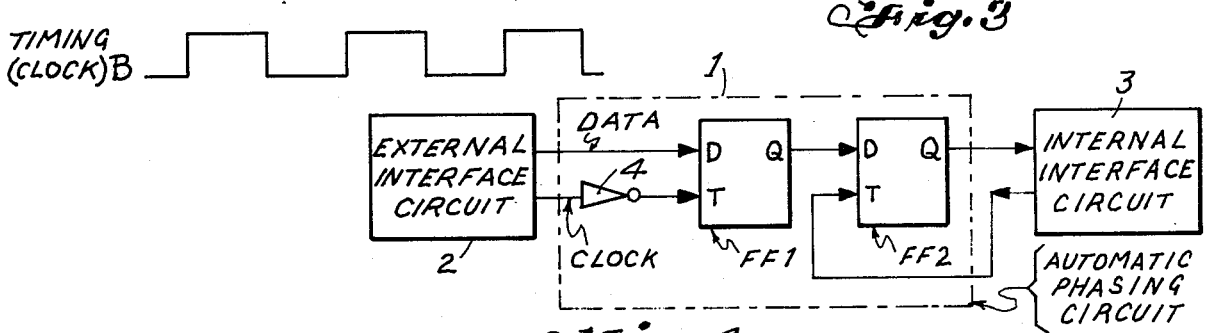

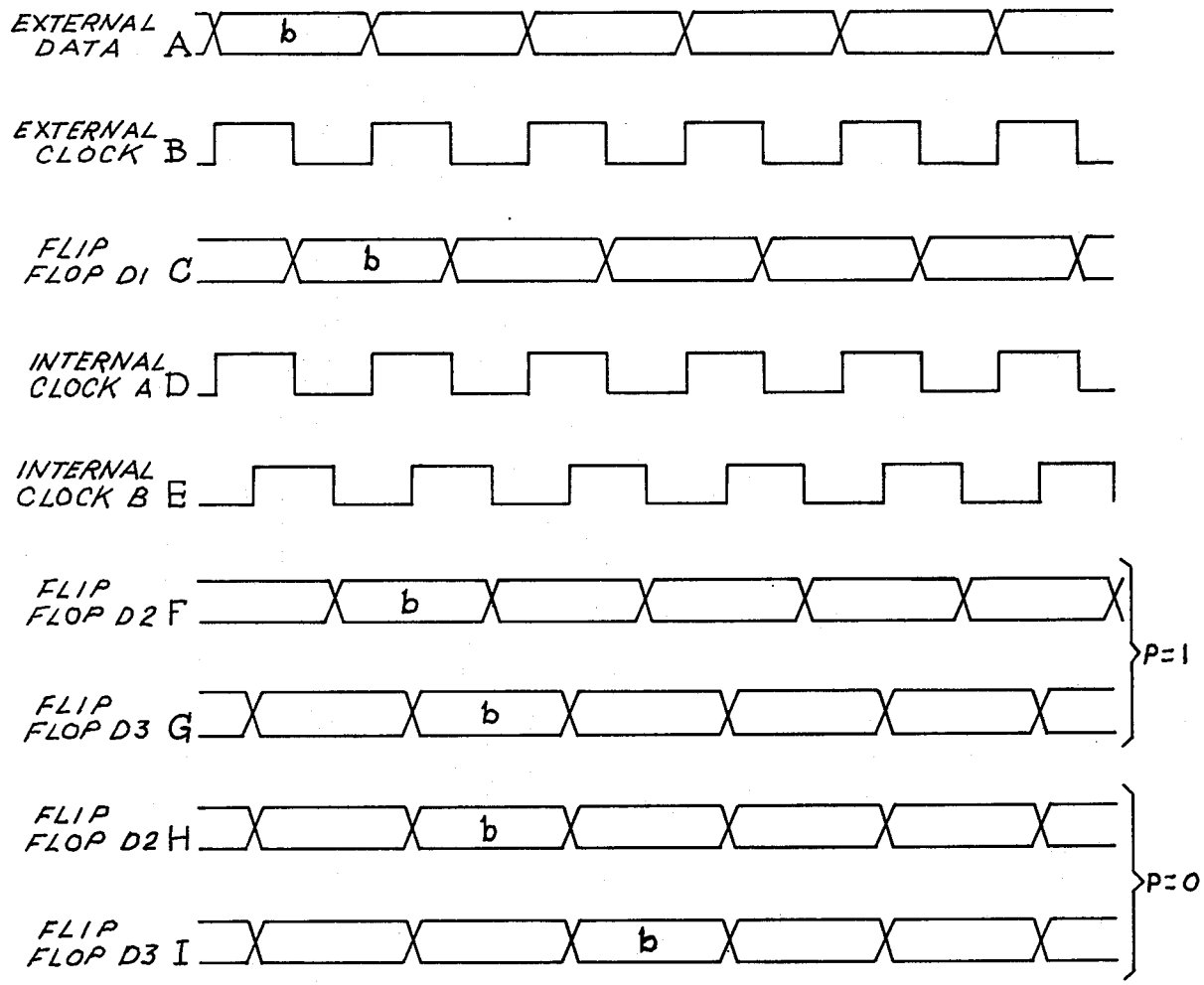
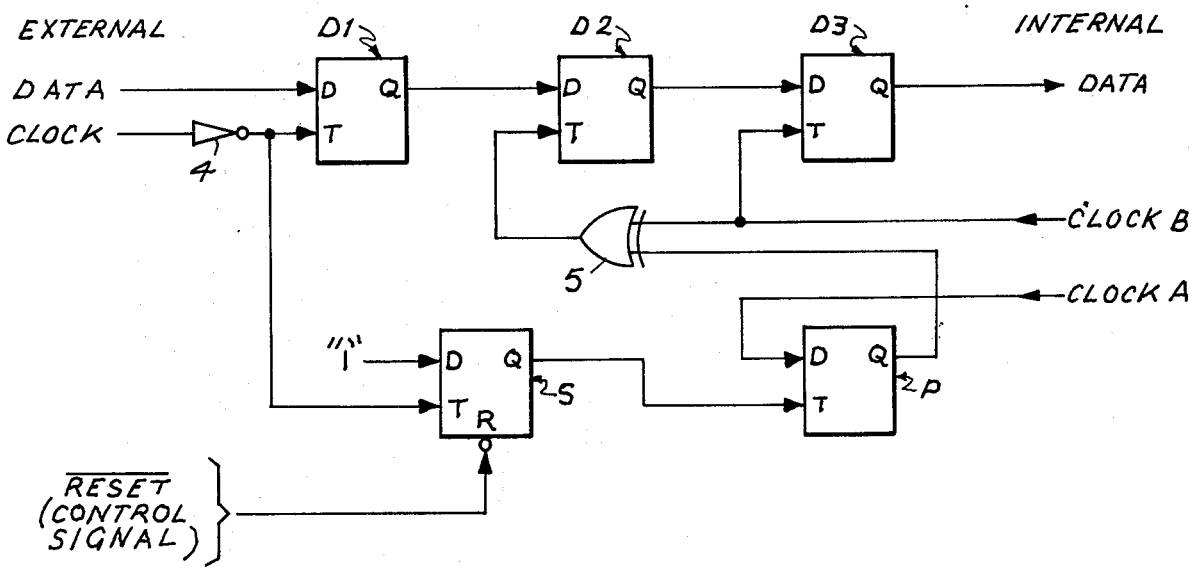

AUTOMATIC PHASING CIRCUIT TO TRANSFER DIGITAL DATA FROM AN EXTERNAL INTERFACE CIRCUIT TO AN INTERNAL INTERFACE CIRCUIT

BACKGROUND OF THE INVENTION

This invention relates to digital communications systems and more particularly to automatic phasing circuits incorporated therein.

The general requirements of an automatic phasing circuit is to automatically reconcile an arbitrary phase difference between an external clock of an external interface circuit and the internal clock of an internal interface circuit where clocks have the same frequency but the phase difference, although fixed, is arbtitrary or unknown. If the arbitrary phase difference between the external and internal clocks is not reconciled, then the digital data will have a bit errors and violations of bit count integrity.

SUMMARY OF THE INVENTION

An object of the present invention is to provide an automatic phasing circuit between an external interface circuit and an internal interface circuit to transfer digital data from the external circuit to the internal circuit with no bit count integrity due to the phase difference between the external and internal clocks.

A feature of the present invention is the provision of an automatic phasing circuit interconnected between an external interface circuit and an internal interface circuit to transfer digital data from the external interface circuit to the internal circuit with no bit errors and no violation of bit count integrity, the digital data in the external interface circuit being related to an external clock having a given frequency and a given phase and the digital data in the internal interface circuit being related to an external clock having a frequency equal to the given frequency and a phase that is different than the given phase, the phasing circuit comprising: a data output from the external interface circuit; a first clock output to couple the external interface circuit; a data input to the internal interface circuit; at least a second clock output to couple the internal clock from the internal interface circuit; at least first and second D-type flip flops having their D inputs and Q outputs coupled in cascade with each other, the data output and the data input; and logic circuitry coupled to the clock output and a selected one of the data output and the first clock output to select one of the internal clock and an inverted version of the internal clock as the clock for the first flip flop to provide the digital data transfer.

BRIEF DESCRIPTION OF THE DRAWING

Above-mentioned and other features and objects of this invention will become more apparent by reference to the following description taken in conjunction and the accompanying drawing, in which:

FIG. 1 is a block diagram illustrating the general relationship between an automatic phasing circuit and the external and internal interface circuits;

FIG. 2 is a timing diagram illustrating the relationship of the timing signal or clock and data in both the external interface circuit and the internal interfare circuit;

FIGS. 3-7 illustrate logic diagrams and timing diagrams of the evolution of the design of an automatic phasing circuit to provide an automatic phasing circuit in accordance with the principles of the present invention;

FIG. 8 is a logic diagram of a first embodiment of an automatic phasing circuit in accordance with the principles of the present invention;

DESCRIPTION OF THE PREFERRED EMBODIMENTS

Figure 9:
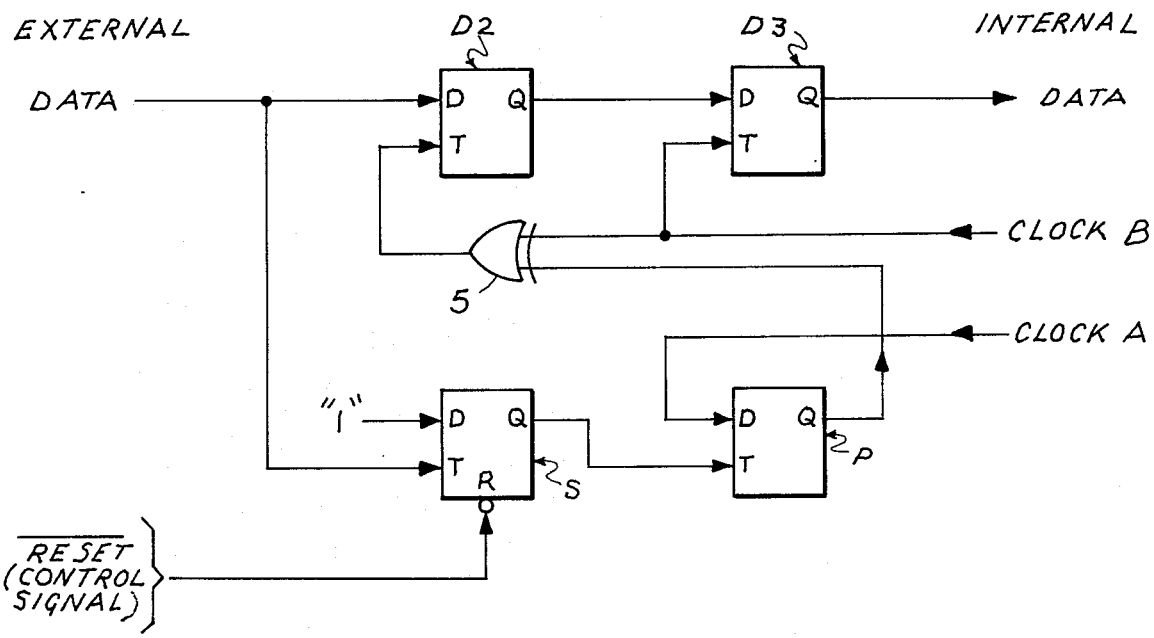
FIG. 9 is a logic diagram of a second embodiment of an automatic phasing circuit in accordance with the principles of the present invention.

Referring to FIG. 1, the automatic phasing circuit 1 is employed to transfer data from external interface circuit 2 to internal interface circuit 3 without bit errors and no violation of bit count integrity. The timing signal or clock and data of both circuits 2 and 3 have the relation illustrated in FIG. 2, but the clocks of circuits 2 and 3, while having the same frequency, will have a phase difference, although fixed, which is arbitrary or unknown. Thus, the automatic phasing circuit 1 must be capable of transferring the digital data from circuit 2 to circuit 3 with no bit error and no violation of the bit integrity, but delay in the data path is permitted.

The nature of the problem can be made clearer by explaining why the circuit of FIG. 3 is not satisfactory. The D-type flip flop FF1 and FF2 sample data on the rising edge of the clock. Since the clock to flip flop FF1 is inverted by inverter 4, this inverted clock will sample the external data as the center of each bit. This is good because this timing of the sample permits more error of the timing of the data transition without any bit errors. The clock flip flop FF2 will cause the internal data to change at the rising edge of the internal clock as illustrated by FIG. 2. However, since the phase difference between the external and internal clocks is arbitrary, there is no guarantee that the output signal of flip flop FF1 will not change while it is being sampled by flip flop FF2. If the data is changing while it is being sampled, the result (the output signal of flip flop FF2) will be certain and bit errors will sometimes occur.

Placing an additional sampling flip flop FF3 intermediate flip flops FF1 and FF2 as shown in FIG. 4 permits an intermediate timing to be selected such that the above situation mentioned with respect to FIG. 3 is avoided. The EXCLUSIVE OR gate 5 inverts the internal clock for a select signal equal to 1 and passes the internal clock without inversion for a select signal equal to 0. If the inverted internal clock rising edge coincides or even comes close to the data transitions from flip flop FF1, then the uninverted internal clock can be selected. If the rising edge of the uninverted internal clock comes close to the data transitions at the output of flip flop FF1, then the inverted internal clock can be selected. At least one of the two internal clock phases (and sometimes both) will be satisfactory for transferring data from flip flop FF1 to flip flop FF3. When the inverted internal clock is selected, flip flops FF2 and FF3 will be clocked alternately at different times, and, therefore, there will be clocked alternately at different times, and, therefore, there will be a problem transferring data from flip flop FF3 to flip flop FF2. When the uninverted internal clock is selected, there is no problem, because the delay of gate 5 and of flip flop FF3 helps. The rising edge of the internal clock first samples the flip flop FF3 output signal transferring the data from flip flop FF3 to flip flop FF2. Then after the delay of gate 5 and flip flop FF3, the output of flip flop FF3 will change as data is transferred from flip flop FF1 to flip flop FF3.

To complete the circuit, the phase select control signal must be generated automatically as a result of appropriate phase comparisons. The phase comparison is more easily made if two phases of the internal clock are available as shown in FIG. 5. FIG. 6 illustrates the relationship between internal clocks A and B and the internal data. If the external timing and the internal timing (clock B) nearly coincide, then flip flop P will sample a 1, and will select the inverted phase of clock B for triggering flip flop D2. If the external timing and the internal timing (clock B) are nearly opposite, then flip flop P will sample a 0 and will select the original phase of clock B for triggering flip flop D2. In any case, flip flop D2 will never sample output signal flip flop D1 when it is changing.

However, suppose the relative phase of the internal and external clocks is such that flip flop P samples internal clock A when it is changing as shown in FIG. 7. In this situation, flip flop P might sample either a 1 or a 0 depending on the minor disturbances that may effect circuit delays, such as temperature. FIG. 7 shows the timing of flip flops D2 and D3 for both the case that the output signal P of flip flop P equals 1 and the case that the output signal P of flip flop P equals 0. A typical data bit is labelled to show how this bit will be delayed differently and, therefore, timed at flip flop D3 differently for each value of P. This diagram of FIG. 7 shows that in this situation, minor disturbances can move the position of data bits, thus causing errors in the data. As a result the circuity of FIG. 5 is unsatisfactory because it will not perform satisfactorily in all possible situations. In the above situation, both the P equals 1 and the P equals 0 selections are satisfactory, but it is not satisfactory to change from one selection to the other.

FIG. 8 represents a first embodiment of the phasing circuit of the present invention which is satisfactory for all possible situations. The components shown in FIG. 8 are the same as those shown in FIG. 5 with the addition of an extra flip flop S. The Flip flop S allows a phase selection to be made initially, but does not allow the selection to change thereafter. A low (logic 0) pulse on the $\overline{\text{RESET}}$ control input resets flip flop S. The next falling transition of the external after the reset pulse will trigger flip flop S which samples a logic 1 on its D input and is set. The rising output of flip flop S then triggers flip flop P which samples clock A, thereby selecting the clock phase of clock B for triggering flip flop D2. The selection cannot change until another $\overline{\text{RESET}}$ pulse is provided, because for flip flop P to change, it must be triggered by a rising edge from flip flop being set. But flip S, although it may remain set, cannot become set until it is first reset.

Because a control input is needed, the circuit of FIG. 7 is not fully automatic. However, other circuits commonly present in the communications equipment can be used to provide the $\overline{\text{RESET}}$ control signal. The reset will typically be provided when power-on is detected and when loss of traffic (data activity) of loss of sync is detected. The objective is to allow an automatic phase selection when normal data activity begins and to maintain this selection as long as data activity remains normal.

As previously mentioned, the external clock triggering flip flop D1 causes the external data to be sampled at the center (timing-wise) of each bit, thus allowing a ½-bit-period margin on either side of the sampling time. In case that a ¼-bit-period margin is considered adequate, the external clock signal and flip flop D1 may be eliminated as shown in FIG. 9, thereby reducing circuit costs. In this circuit, the timing of the data transition which triggers flip flop S directly determines the selected phase, and the data is sampled into flip flop D2 within ¼-bit-period of the center of each bit, which is the same operation as present in the circuit of FIG. 8.

Figure 10:
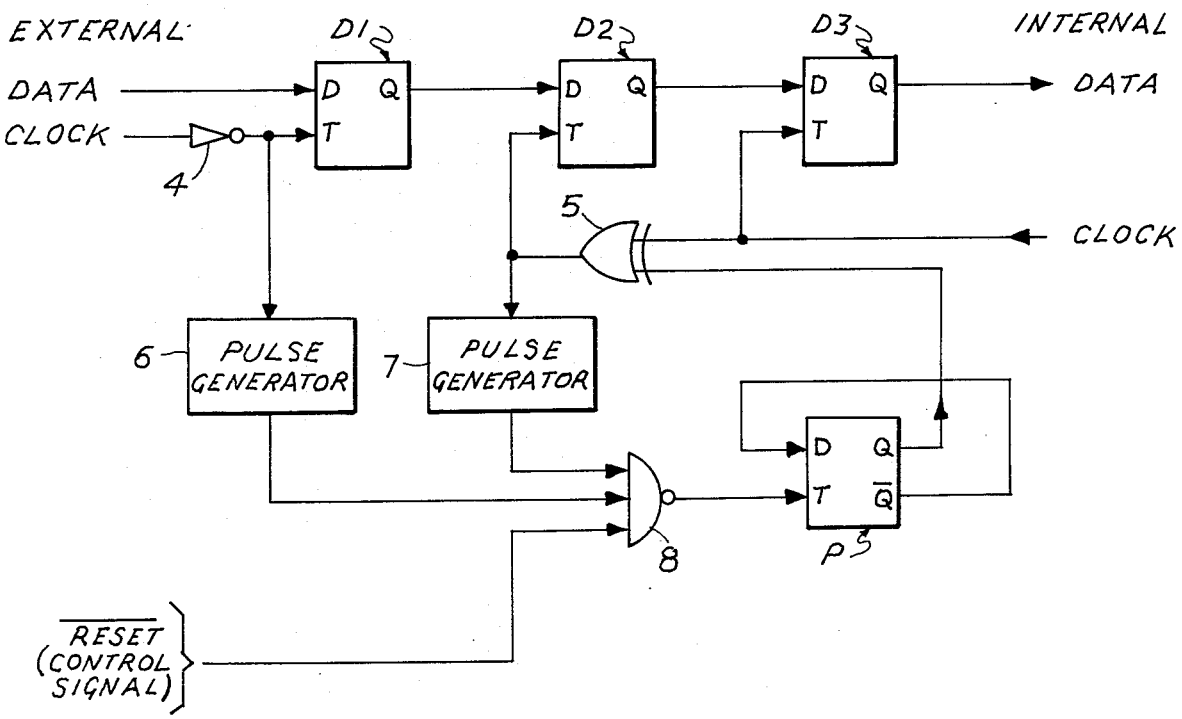
FIG. 10 is a logic diagram of a third embodiment of an automatic phasing circuit in accordance with the principles of the present invention.

FIG. 10 discloses another embodiment for phase selection. Each of the pulse generators 6 and 7 generates a short pulse when triggered by a rising input. If the trigger inputs to flip flops D1 and D2 and also to the pulse generaors 6 and 7 are sufficiently close in time, then at least part of the two generated pulses will be simultaneous, allowing the NAND gate 8 to trigger flip flop P. The $\overline{Q}$ output to D input connection of flip flop P causes flip flop P to change state when triggered, thus reversing the phase selection. If the width of the generator pulses are always less than the ¼-bit-period, no part of the generated pulses will coincide after the phase selection is reversed. Therefore, the phase selection can change only once. However, if when normal data activity begins, the phase of the flip flop D1 and flip flop D2 trigger inputs is almost, but not quite close enough to generate a trigger pulse to flip flop P and then later a minor disturbance moves the phase closer, the phase selection P may be reversed, and may cause a bit count integrity error in the middle of normal data activity. To prevent this, the ENABLE signal shown is provided in a manner similar to the $\overline{\text{RESET}}$ signal discussed previously with respect to FIGS. 8 and 9.

Figure 11:
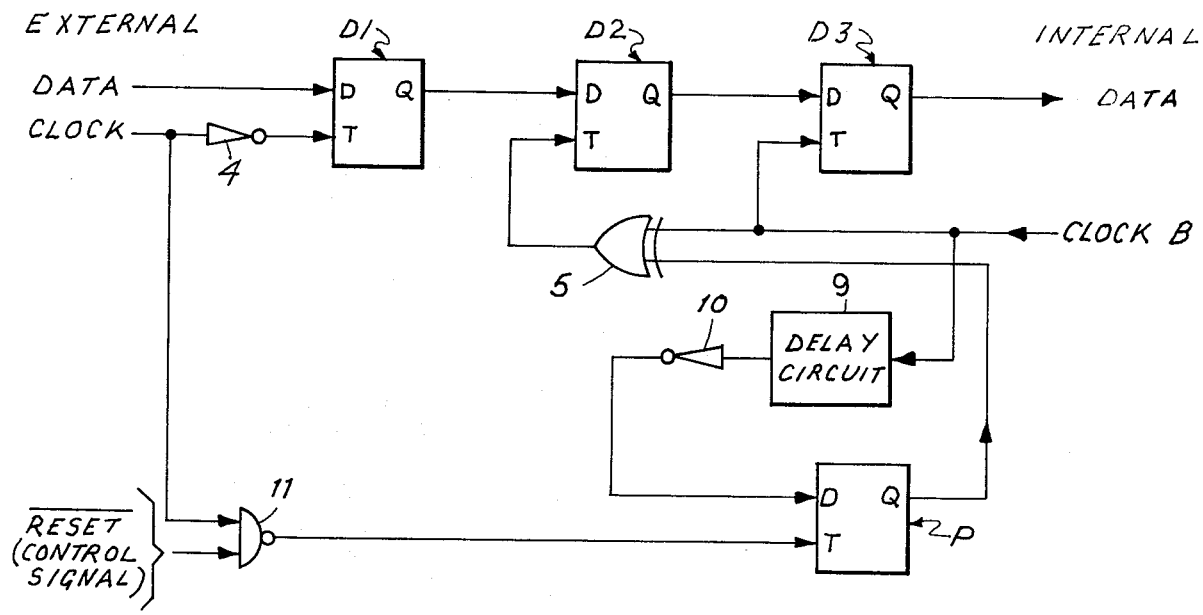
FIG. 11 is a fourth embodiment of an automatic phasing circuit in accordance with the principles of the present invention.

FIG. 11 shows a variation of the circuit of FIG. 8. A delay circuit 9 and an inverter 10 is used to generate clock A from clock B, thus requiring only one internal clock input. Also an ENABLE control input and NAND gate 11 is used instead on the $\overline{\text{RESET}}$ control input and flip flop S.

Figure 12:
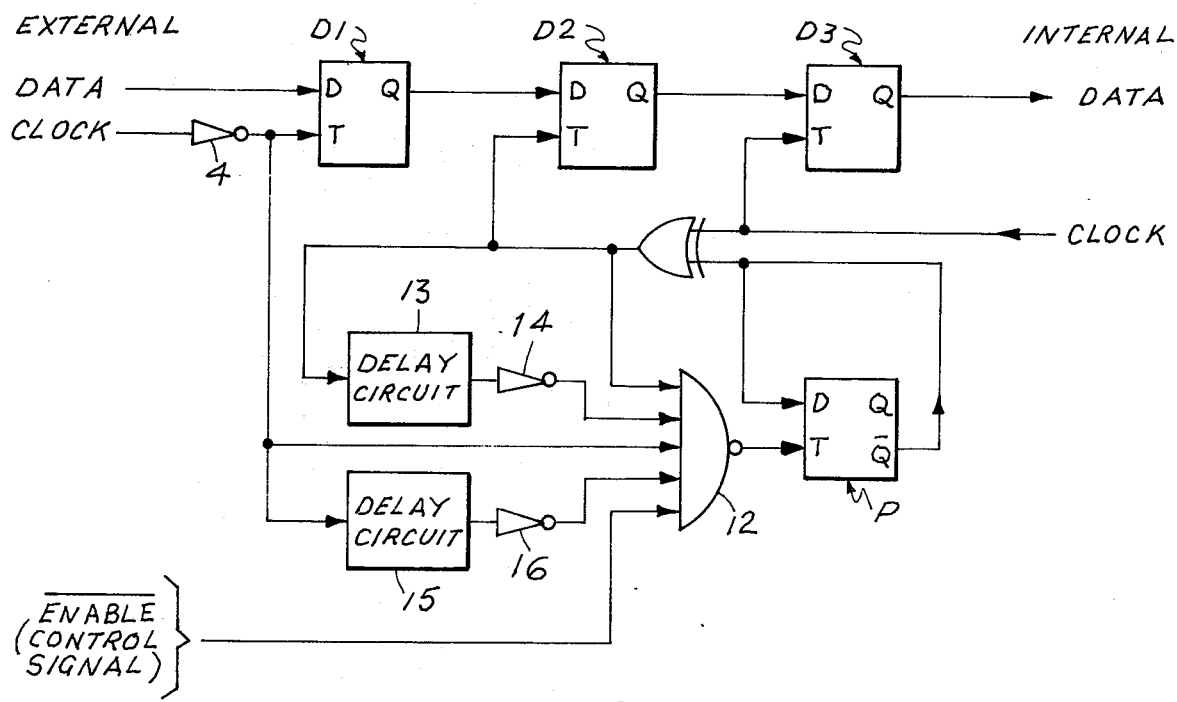
FIG. 12 is a logic diagram of a fifth embodiment of an automatic phasing circuit in accordance with the principles of the present invention.
Figure 13:
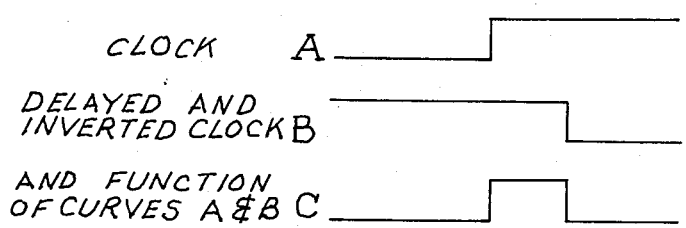
FIG. 13 is a timing diagram useful in illustrating the operation of FIG. 12.

FIG. 12 shows a variation of FIG. 10. In FIG. 12 the AND function of a clock signal (Curve A, FIG. 13) and the same clock signal inverted and delayed (Curve B, FIG. 13) generates a pulse for each rising transition as shown in Curve C, FIG. 13. The timing signal flip flop D2 is coupled directly to NAND gate 12 and to delay circuit 13 and inverter 14 to NAND gate 12 with the NAND gate 12 performing the AND function. Likewise, the clock input to flip flop D1 is coupled directly to NAND gate 12 and through delay circuit 15 and inverter 16 to NAND gate 12. As in the case of FIG. 10, the ENABLE control signal is couple to NAND gate 12 with the output therefrom triggering flip flop P to perform the desired phase selection of the internal clock.

While I have described above the principles of my invention in connection with specific apparatus it is to be clearly understood that this description is made only by way of example and is not as a limitation to the scope of my invention as set forth in the objects thereof and in the accompanying claims.

I claim:

1. An automatic phasing circuit interconnected between an external interface circuit and an internal interface circuit to transfer digital data from said external interface circuit to said internal interface circuit with no bit errors and no violation of bit count integrity, said digital data in said external interface circuit being related to an external clock having a given frequency and a given phase and said digital data in said internal interface circuit being related to an internal clock having a frequency equal to said given frequency and a phase that is different than said given phase, said phasing circuit comprising:
   a data input from said external interface circuit;
   a first clock input for said external clock;
   a data output to said internal interface circuit;
   at least a second clock input for said internal clock;
   at least first and second D-type flip flops, said first flip flop having its D input coupled to said data input and its Q output coupled to the D input of said second flip flop and said second flip flop having its Q output coupled to said data output; and
   logic circuitry having a first input coupled to a seclected one of said first clock input and said data input, a second input coupled to said second clock input and an output coupled to the clock input of said first flip flop to select one of said internal clock and an inverted version of said internal clock as the clock for said first flip flop to provide said digital data transfer with no bit errors and no violation of bit count integrity.

2. An automatic phasing circuit according to claim 1, wherein
   said logic circuitry includes
   a source of control signal,
   a third clock input to couple a delayed version of said internal clock from said internal interface,
   said second clock output being coupled to the clock input of said second flip flop,
   an EXCLUSIVE-OR gate having one input coupled to said second clock input and its input coupled to the clock input of said first flip flop,
   a third D-type flip flop having its clock input coupled to said data input, its D input coupled to logic "1" and its reset input coupled to said source, and
   a fourth D-type flip flop having its clock input coupled to the Q output of said third flip flop, its D input coupled to said third clock input and its Q output coupled to the other input of said gate to provide said selection.

3. An automatic phasing circuit according to claim 1, wherein
   said logic circuitry includes
   a source of control signal,
   a third clock input for a delayed version of said internal clock,
   a third D-type flip flop having its D input doupled to said data input and its Q output coupled to the D input of said first flip flop,
   an inverter having its input coupled to said first clock input and its output coupled to the clock input of said third flip flop,
   said second clock input being coupled to the clock input of said second flip flop,
   an EXCLUSIVE-OR gate having one input coupled to said second clock input and its output coupled to the clock input of said first flip flop,
   a fourth D-type flip flop having its D input coupled to logic 1, its clock input coupled to the output of said inverter and its reset input coupled to said source, and
   a fifth D-type flip flop having its clock input coupled to the Q output of said fourth flip flop, its D input coupled to said third clock input and its Q output coupled to the other input of said gate to provide said selection.

4. An automatic phasing circuit according to claim 1, wherein
   said logic circuitry includes
   a source of control cignal,
   a third D-type flip flop having its D input coupled to said data input and its Q output coupled to the D input of said first flip flop,
   an inverter having its input coupled to said clock input and its output coupled to the clock input of said third flip flop,
   said second clock input being coupled to the clock input of said second flip flop,
   an EXCLUSIVE-OR gate having one input coupled to said second clock input and its output coupled to the clock input of said first flip flop, a first pulse generator coupled to the output of said inverter
   a second pulse generator coupled to the output of said EXCLUSIVE-OR gate,
   a NAND gate coupled to said first and second pulse generators and said source, and
   a fourth D-type flip flop having its clock input coupled to the output of said NAND gate its $\overline{Q}$ output coupled to its D input and its Q output coupled to the other input of said EXCLUSIVE-OR gate to provide said selection.

5. An automatic phasing circuit according to claim 1, wherein
   said logic circuitry includes
   a source of control signal,
   a third D-type flip flop having its D input coupled to said data input and its Q output coupled to the D input of said first flip flop,
   a first inverter having its input coupled to said first clock input and its output coupled to the clock input of said third flip flop,
   a first inverter having its input coupled to said first clock input and its output coupled to the clock input of said third flip flop,
   a NAND gate coupled to said first clock input and said source,
   said second clock input being coupled to the clock inpur of said second flip flop,
   an EXCLUSIVE-OR gate having one input coupled to said second clock input and its output coupled to the clock input of said first flip flop,
   a delay circuit coupled to said second clock input and
   a second inverter coupled to the output of said delay circuit, and
   a fourth D-type flip flop having its D input coupled to the output of said second inverter, its clock input coupled to the output of said NAND gate and its Q output coupled to the other input of said EXCLUSIVE-OR gate to provide said selection.

6. An automatic phasing circuit according to claim 1, wherein
   said logic circuitry includes
   a source of control signal, a third D-type flip flop having its D input coupled to said data input and its Q output coupled to the D input of said first flip flop, a first delay circuit coupled to the output of said first inverter, a second inverter coupled to the output of said first delay circuit, said second clock input being coupled to the clock input of said second flip flop, an EXCLUSIVE-OR gate having one input coupled to said second clock input and its output coupled to the clock input of said first flip flop, a second delay circuit coupled to the output of said EXCLUSIVE-OR gate, a third inverter coupled to the output of said second delay circuit, a NAND gate coupled to the output of said first, second and third inverters, the output of said EXCLUSIVE-OR gate and said source, and a fourth D-type flip flop having its clock input coupled to the output of said NAND gate and its $\overline{Q}$ output coupled to its D input and the other input of said EXCLUSIVE-OR gate to provide said selection.

* * * * *